(12) United States Patent  
Rosmeulen

(10) Patent No.: US 8,900,801 B2  
(45) Date of Patent: Dec. 2, 2014

(54) METHOD FOR PRODUCING A LED DEVICE
(71) Applicant: IMEC, Leuven (BE)
(72) Inventor: Maarten Rosmeulen, Leuven (BE)
(73) Assignee: IMEC, Leuven (BE)
( * ) Notice: Subject to any disclaimer, the term of this patent is extended or adjusted under 35 U.S.C. 154(b) by 0 days.
(21) Appl. No.: 13/715,763
(22) Filed: Dec. 14, 2012
(65) Prior Publication Data
 US 2013/0177856 A1 Jul. 11, 2013

Related U.S. Application Data

(60) Provisional application No. 61/584,143, filed on Jan. 6, 2012.
(51) Int. Cl.
 *G03F 7/00* (2006.01)
 *H01L 33/22* (2010.01)
(52) U.S. Cl.
 CPC .............. *G03F 7/0005* (2013.01); *H01L 33/22* (2013.01)
 USPC ............................ 430/319; 430/320; 430/311
(58) Field of Classification Search
 CPC ............ H01L 27/1214; H01L 51/0022; H01L 2933/0091; H01L 33/42; H01L 33/44; H01L 33/22; H01L 33/06; H01L 33/505; H01L 2933/0083; H01L 31/02363; H01L 33/20; G03F 7/0005; G03F 7/30; G03F 7/322
 USPC .......................................... 430/319, 320, 311
 See application file for complete search history.

(56) References Cited

U.S. PATENT DOCUMENTS 4,368,245 A  1/1983  Bayer
5,510,156 A  4/1996  Zhao
(Continued)

FOREIGN PATENT DOCUMENTS

CN  102054279 A  5/2011
EP  0 977 277 A1  2/2000
(Continued)

OTHER PUBLICATIONS

Pham et al. "Substrate Transfer for GaN based LEDs grown in Silicon", IMPAS 44 International Symposium on Microelectronics, Oct. 9-13, 2011, Long Beach, California, ISBN 0930815947, pp. 130-135.
Pham et al., 'Substrate Transfer for GaN based LEDs grown in Silicon', IMAPS 44 International Symposium on Microelectronics, Oct. 9-13, 2011, Long Beach California, ISBN 0930815947, pp. 130-135.

*Primary Examiner* — Caleen Sullivan
(74) *Attorney, Agent, or Firm* — Knobbe, Martens, Olson & Bear, LLP

(57) ABSTRACT

A method is provided for producing a LED device, comprising a stack of layers comprising a light producing layer the light producing layer not being the top or bottom layer of the stack, wherein a layer at the top or bottom of the stack is subjected to a texturization aimed at enhancing the light extraction efficiency of the LED, wherein the texturization comprises the step of producing on the top or bottom surface a plurality of surface features, the surface features being arranged according to a pattern defined by starting from a regular pattern of features and subjecting each feature of the regular pattern to a deviation from the location in the regular pattern, the deviation being in a random direction and/or having a random amplitude. According to another embodiment, a random deviation is applied to one or more dimensions of the features in the regular pattern.

13 Claims, 5 Drawing Sheets

(56) References Cited

U.S. PATENT DOCUMENTS

| | | |
|---|---|---|
| 6,504,180 B1 | 1/2003 | Heremans et al. |
| 2003/0000914 A1 | 1/2003 | Knappenberger et al. |
| 2003/0075723 A1 | 4/2003 | Heremans et al. |
| 2006/0001046 A1* | 1/2006 | Batres et al. ................ 257/202 |
| 2006/0055627 A1 | 3/2006 | Wilson |
| 2008/0020291 A1 | 1/2008 | Lu |
| 2008/0182082 A1 | 7/2008 | Nakao |
| 2013/0130180 A1* | 5/2013 | Pham et al. ................ 430/319 |

FOREIGN PATENT DOCUMENTS

| | | |
|---|---|---|
| JP | 2004-95898 A | 3/2004 |
| JP | 2004-272195 A | 9/2004 |
| JP | 2009-193021 A | 8/2009 |

* cited by examiner a b c d

METHOD FOR PRODUCING A LED DEVICE

CROSS-REFERENCE TO RELATED APPLICATION

This application claims the benefit of U.S. Provisional Application No. 61/584,143, filed Jan. 6, 2012, the disclosure of which is hereby expressly incorporated by reference in its entirety and is hereby expressly made a portion of this application.

FIELD OF THE DISCLOSURE

The present disclosure relates to the field of semiconductor processing, in particular to the field of Light Emitting Diode (LED) devices, such as GaNLEDs (Gallium Nitride LEDs).

STATE OF THE ART

GaNLED technology has become important in the development and production of various applications, such as notebook and TV backlighting and general lighting. It is known that surface texturization of the GaN layer improves the light extraction efficiency of the LED (extract more light from the device). Texturizing of GaN can be done with a suitable wet etching solution such as KOH or by dry etching of the GaN layer. The latter technique involves the use of a mask that defines a pattern of texturing features on the surface. Conventional I-line lithography and chlorine based dry etching may be used to produce the features on the surface according to the pattern defined by the mask. Another option is to provide a layer of polystyrene spheres on the surface, and using the spheres as a mask for the dry etch. These techniques are illustrated for example in EP0977277.

In the above-described techniques, it is known that the pattern of features transferred to the textured surface is preferably not a regular pattern, i.e. the size of the features and the distance between neighboring features is not constant over the surface. Regular patterns tend to capture too much light emitted by the LED's light emitting layer through repeated reflection of the light along the same reflection angles. More randomness enhances the variability of the reflection angles and therefore the amount of light emerging from the LED device. Random patterned masks and lithography is therefore a preferred option, or the solution of the styrene spheres, which creates a fully random pattern over a large surface.

Even though it is agreed that a non-regular pattern is ideal, it was found that light extraction efficiency may decrease when too many features are close together in one area and/or too far apart in other areas of the textured surface. This may be more or less the case depending on the size and mutual distance of the features. In other words, a degree of control over the randomness of the patterns is lacking in the prior art production methods, which leads to an unpredictability in terms of the performance of the devices.

SUMMARY OF THE DISCLOSURE

The disclosure relates to a method as disclosed in the appended claims. The disclosure thus relates to a method for producing a LED device, comprising a stack of layers comprising a light producing layer the light producing layer not being the top or bottom layer of the stack, the method comprising a texturization step, wherein a layer at the top or bottom of the stack is subjected to a texturization aimed at enhancing the light extraction efficiency of the LED, wherein the texturization comprises the step of producing on the top or bottom surface a plurality of surface features, the surface features being arranged according to a pattern defined by starting from a regular pattern of features and subjecting each feature of the regular pattern to a deviation from the location in the regular pattern, the deviation being in a random direction and/or having a random amplitude.

According to an embodiment, the amplitude of the deviation is not higher than the pitch of the features of the regular pattern.

According to a further embodiment, the amplitude of the deviation is such that essentially no surface features are mutually overlapping in the pattern.

According to a specific embodiment, the amplitude of the deviation is not higher than half of the pitch of the features of the regular pattern.

The amplitude of the deviation may be configured to be according to a predefined statistical distribution, such as a uniform or a Gaussian distribution.

According to an embodiment, the pitch of the features of the regular pattern is between 0.2 micron and 2 micron.

According to an embodiment, the surface features are shaped as cone or pyramid-shaped pillars with a flat top surface, flat areas between the pillars, the pillars having slanted side surfaces. Preferably, the side surface are inclined at an angle between 25° and 45°, with respect to the plane of the texturized surface, preferably between 25° and 30°.

According to an embodiment, the width of the top surface of each feature is configured so that the emission cone emitted from the point of the light-producing layer situated underneath the mid-point of the top surface and received by the top surface, essentially corresponds to the escape cone of light emitted by the light producing layer through a non-texturized surface having the same thickness as the top surface.

In the embodiment involving cone shaped or pyramidal surface features, the amplitude of the deviation is preferably not higher than one fourth of the pitch of the features of the regular pattern.

According to an embodiment, the texturization comprises a lithography step wherein a mask is used, the mask having openings arranged according to the non-regular pattern.

The disclosure is equally related to a method for producing a LED device, comprising a stack of layers comprising a light producing layer the light producing layer not being the top or bottom layer of the stack, the method comprising a texturization step, wherein a layer at the top or bottom of the stack is subjected to a texturization aimed at enhancing the light extraction efficiency of the LED, wherein the texturization comprises the step of producing on the top or bottom surface a plurality of surface features, the surface features being arranged according to a pattern defined by starting from a regular pattern of features of equal size and shape and subjecting one or more dimensions of each feature of the regular pattern to a random deviation from the dimensions of the equal-sized.

DETAILED DESCRIPTION OF THE DISCLOSURE

Figure 1:
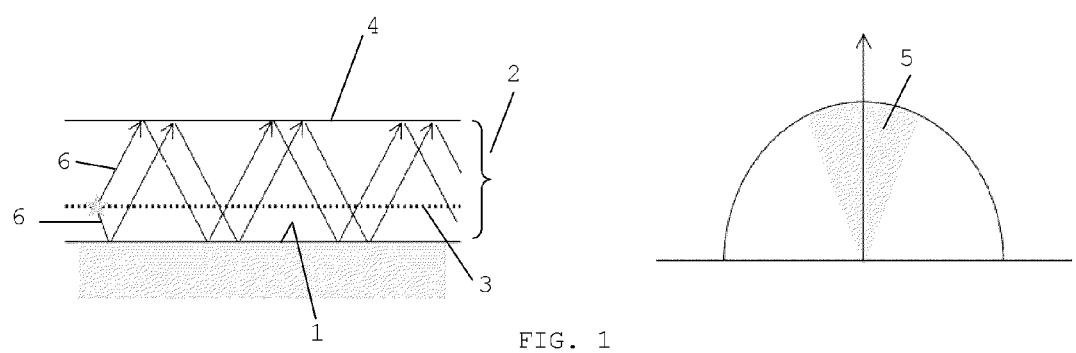
FIG. 1 illustrates the problem of light becoming trapped in a LED device provided with a non-texturized surface.
Figure 2:
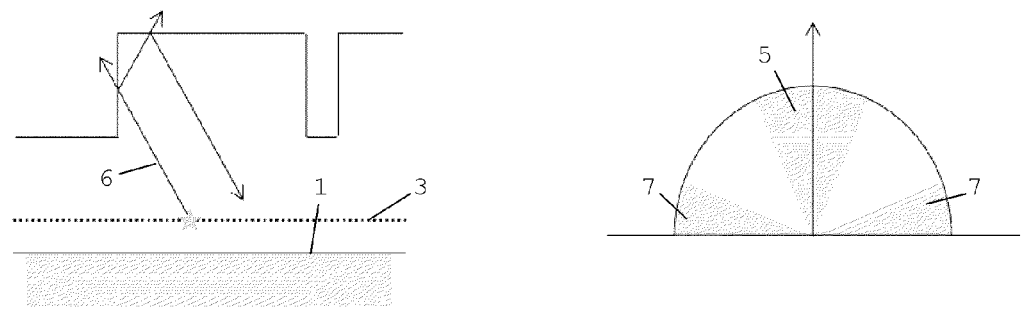
FIG. 2 illustrates the improvement in terms of light extraction efficiency obtained through texturization of the surface.
Figure 3:
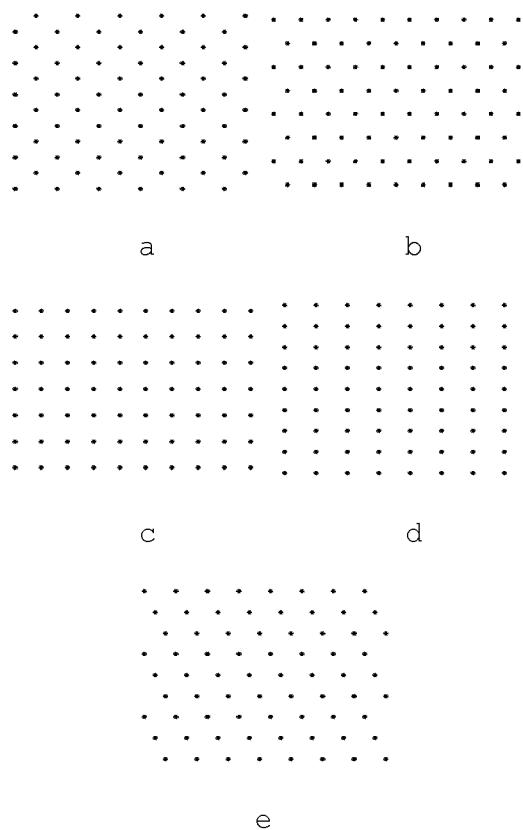
FIGS. 3a-e show examples of regular patterns of surface features.

The disclosure relates to a method for producing a LED comprising a stack of layers, the stack comprising a light producing layer (such as one or more quantum wells) in the interior of the stack, i.e. not at the top or bottom of the stack. FIG. 1 illustrates in a very schematic way the basic structure of such a LED device, including a mirror surface 1, the LED stack 2, with the light-producing layer 3. For a top layer that is not texturized as in FIG. 1, light emitted in directions outside the so-called 'escape cone' 5 is for the most part trapped inside the layer due to the repeated reflections of the emitted beams 6. As known in the art, it is advantageous to texturize the top surface 4 of the stack in order to extract light emitted in other directions apart from the escape cone, as illustrated in FIG. 2. Apart from the escape cone 5 defined by the horizontal parallel surfaces, additional escape cones 7 appear defined by the vertical parallel surfaces. Slanted surfaces lead to a further improvement in terms of the extracted light efficiency.

According to the disclosure, the texturization is done by producing a plurality of surface features on the surface, for example microscopic pillars or depressions in the surface, the surface features being arranged according to a non-regular pattern defined by starting from a regular pattern of features and subjecting each feature of the regular pattern to a deviation from the location in the regular pattern, the deviation being in a random direction and/or having a random amplitude. A regular pattern is a pattern wherein each feature has the same pre-defined relative position with respect to adjacent features. The random deviation is hereafter referred to as a 'jitter' imposed on the regular pattern.

The regular pattern may be for example rhombic (checkerboard pattern), hexagonal, square, rectangular or oblique, as illustrated in FIGS. 3a to 3e respectively, but any other regular pattern may be chosen. The amplitude of the jitter (how much the feature deviates from the regular position) may have a fixed value applied in a random direction around the regular feature positions, or it may itself be random (combined with a random or non-random direction of the jitter). It may be random but confined within a predefined interval of deviations, for example between zero and a maximum or between a minimum and maximum deviation. According to a preferred embodiment, the direction of the jitter is random and the amplitude of the jitter is random but configured to have a predefined statistical distribution, for example a uniform or a Gaussian distribution, around the regular position of the features, and deviating from the regular position in a random direction. Variance values of such distributions may be chosen in order to obtain more or less spread of the features over the surface 4 with respect to the regular pattern positions.

Figure 4:
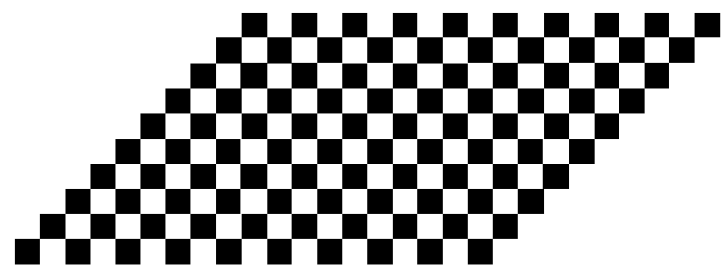
FIGS. 4a-d illustrate a rhombic pattern of features provided with various degrees of a 'jitter' according to the disclosure.
Figure 4:
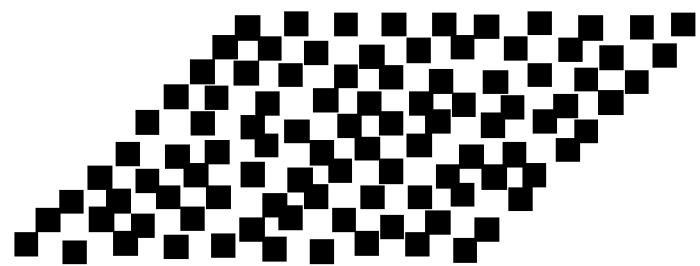
Figure 4:
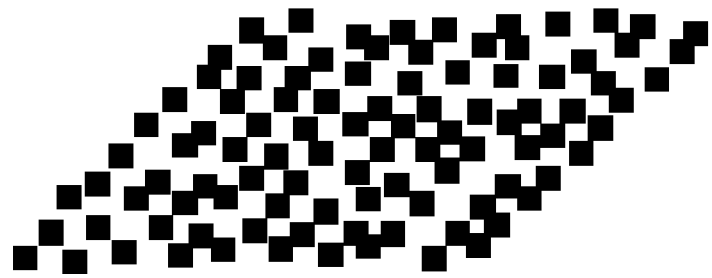
Figure 4:
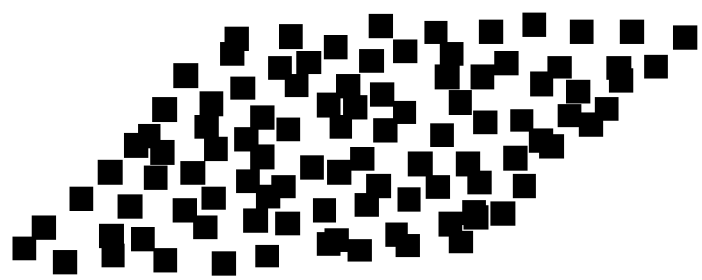

FIG. 4a illustrates a 50% rhombic pattern (i.e. the surface features cover 50% of the surface before the jitter is applied). FIGS. 4b to 4d illustrate the same pattern, with a uniformly distributed jitter applied to it with increasing maximum amplitude.

Figure 5A:
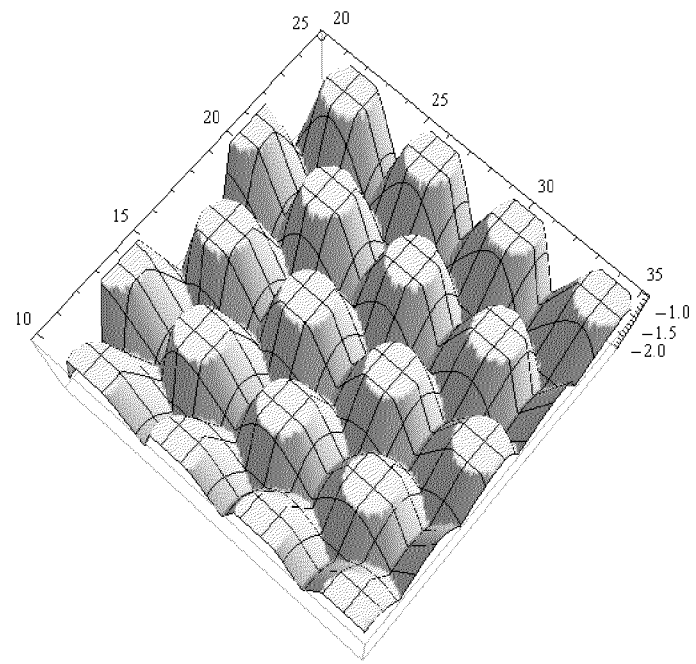
FIGS. 5a-b give an example of a hexagonal pattern before and after application of a 'jitter' to the pattern.
Figure 5B:
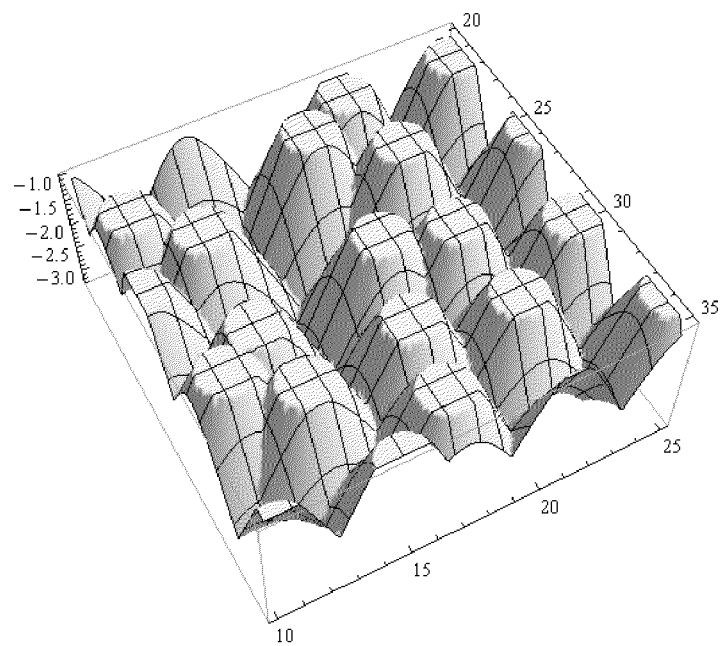

FIG. 5a shows an example of a hexagonal regular pattern of pillar-like structures. FIG. 5b shows a jittered pattern (uniform distribution) according to the disclosure and based on the pattern of FIG. 5a, with the pillars deviating from their regular positions. The scales indicated in these drawings are in microns.

The 'jittered' pattern may be applied to the surface of the LED, e.g. to a GaN-based layer stack comprising multiple quantum wells, by a known technique, preferably by a dry etch involving a mask and standard lithography, wherein the pattern is transferred to a resist layer by illuminating the resist through the mask, developing and removing the illuminated resist and etching openings in the stack's top layer as defined by the resist openings, before finally removing the resist. The result is a surface provided with pillar-like features. Alternatively, with the opposite mask and resist polarity, the resist portions that are not illuminated are developed and removed, leaving islands of resist, followed by the dry etch which creates inversed pillar-shaped depressions in the surface, thereby texturizing the surface.

Another way of producing the pattern is possible when the LED is first produced on a device wafer and subsequently transferred to a carrier wafer, as described for example in 'Substrate Transfer for GaN based LEDs grown in Silicon', Pham et al, IMAPS 44 International Symposium on Microelectronics, Oct. 9-13, 2011, Long Beach Calif., ISBN 0930815947, Page 130-135. Before depositing the layers of the stack on the device wafer, a $SiO_2$ mask (or other materials such as $Si_3N_4$, SiC, silicon-oxynitrides or compounds of Si, O, C and N) may be produced on the device wafer surface, the mask comprising a pattern of openings, the pattern being defined as described above (i.e. regular pattern with jitter added to it). The LED stack is then deposited first on the protrusions defined by the mask, followed by overgrowth. After the transfer of the device to the carrier and removal of the device wafer, the pattern appears on the top surface of the LED. The mask is either removed before LED stack deposition or kept until the substrate is transferred, or even thereafter. This embodiment of the method of the disclosure may be called 'indirect texturization' of the LED layer, whereas dry etching the LED layer directly with the help of a mask is 'direct texturization'. In a process without a device transfer, the indirect method may be used to pattern the bottom surface of the stack 2.

The jittered pattern of the disclosure offers the advantage of a better control and repeatability of the randomness of the pattern, compared to existing methods, while maintaining the advantages of a fully random pattern, i.e. an improvement in terms of the light extraction efficiency of the LED device.

According to a preferred embodiment, the pitch of the features in the regular pattern used to obtain the textured surface is between 0.2 and 2 micron. The pitch is defined as the average distance between corresponding points of two neighboring features, e.g. between the tops of two neighboring pyramidal pillars. In this range, the jitter offers an additional advantage, namely the reduction of directionality of the emitted light. Regular feature patterns in the pitch-range of about 0.2 to 0.5 micron are known as 'photonic lattices' or 'photonic crystals'. These structures are known to emit directional light, i.e. light directed according to a limited angle around a plurality of predefined directions.

Such directionality is a desired feature in some cases, such as in certain types of projectors, but for LEDs it is preferred to have a more diffuse emission of light. A jitter, applied to such photonic lattices in accordance with the disclosure, decreases the directionality of the emitted light. This advantage applies in the above named range of 0.2-2 micron, in which the directionality of the emitted light has been found to exhibit itself most prominently.

The optimal average amplitude of the jitter may differ depending on the shape, size and pitch of the features in the regular pattern on which the jittered pattern is based. It is not preferred to have a too large deviation from the regular position, as this may give rise to overlapping features and larger open spaces between features, which deteriorates the scattering effect of the texturization. Thus, according to a preferred embodiment, the amplitude of the jitter is such that essentially no surface features are overlapping in the pattern resulting from adding the jitter to the regular pattern. According to another embodiment, the amplitude of the jitter is not higher than the pitch of the regular pattern to which the jitter is added, more preferably not higher than half of the pitch of the regular pattern.

Figure 6A:
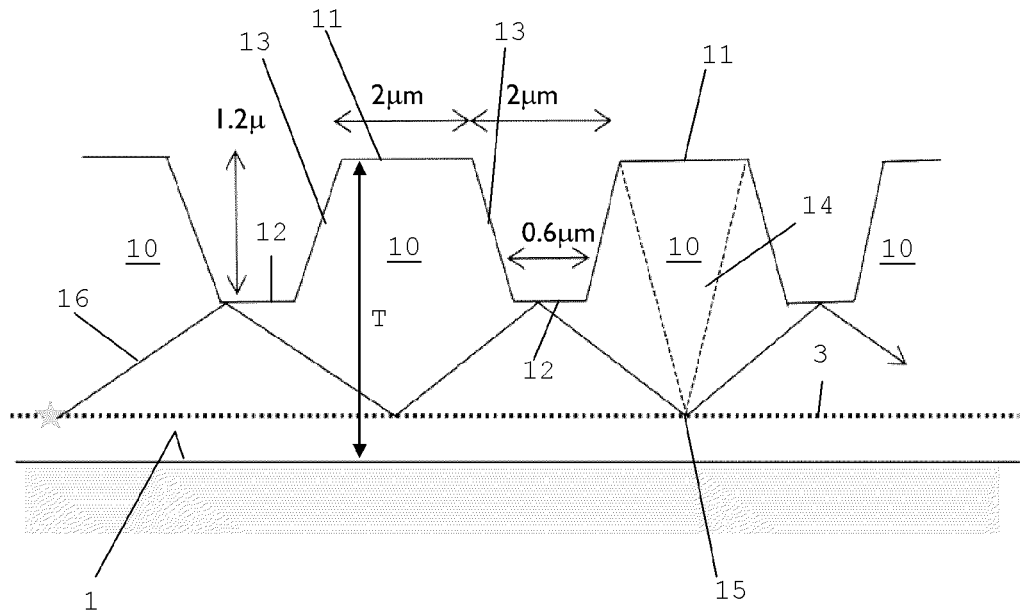
FIGS. 6a-b illustrate a preferred feature geometry especially suitable in combination with the method according to the disclosure.
Figure 6B:
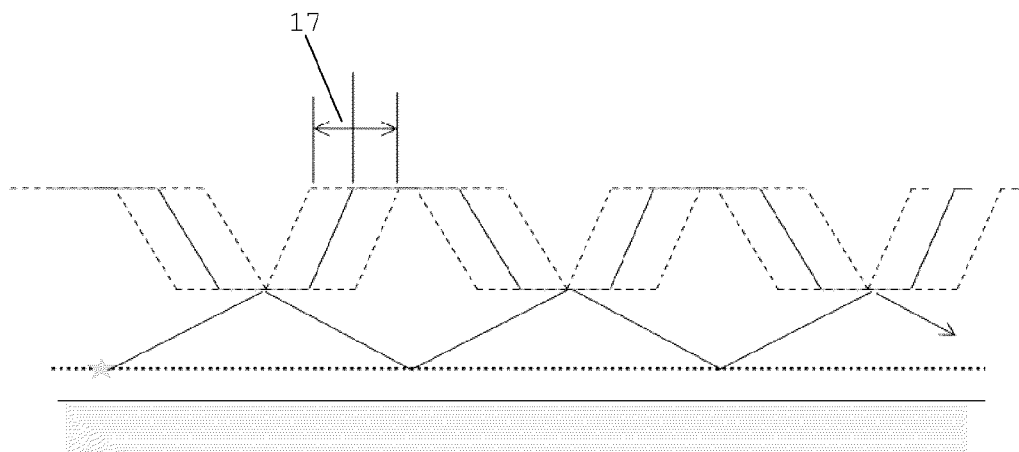

A preferred embodiment of pillar-shaped features that is especially suitable for the method of the disclosure is shown in FIG. 6a. The dimensions that are shown are meant to give a realistic example, and are not limiting the scope of the disclosure. The figure shows the pillars 10 in a regular pattern with a pitch of 4 micron, for example a square or rectangular pattern, i.e. before applying a jitter to the pattern. Each pillar is shaped as a pyramid or cone with a flat top surface 11 and a flat area 12 between two neighboring features. The sides of the features are defined by sloping surfaces 13. The width of the top surfaces 11 of the features is preferably chosen in relation to the position of the light emitting layer 3 and the thickness T of the layer (indicated in FIG. 6a). One way of doing this is by configuring the pillars so that the emission cone 14 received by the flat top surface 11 and emitted from the point 15 situated underneath the middle of the flat surface 11, corresponds essentially with the escape cone as described above, for a non-texturized surface of the same thickness T as the flat surface portions 11. In that way, at least for light emitted from these middle points 15, there is no light trapped in the layer. The angle of the slopes 13 with respect to the vertical is preferably about 25° to 30°, in order to scatter a maximum of light. The flat areas 12 in between the pillars 10 should be as small as possible in order to minimize the amount of light trapped between the parallel surfaces of the mirror and of these flat areas (see beam 16). However, it is difficult to refine the etching and lithography to the extent that the features are very close together so as not to have the open areas 12. The inventors have found that a jitter, preferably a uniformly distributed jitter, with respect to the position of FIG. 5a with a maximum of not more than one fourth of the pitch (so +/−1 micron in the case of the indicated dimensions) is capable of reducing the average 'open area' spaces 12 in the pattern, thereby reducing the amount of trapped light in the device. A higher jitter (preferably uniformly distributed) of maximum up to half the pitch (+/−2 micron) is preferred for reducing the average top surface areas 11. A possible jitter range 17 applied to the pattern of FIG. 6a is schematically illustrated in FIG. 6b.

Possibly in addition to the above-described jitter in terms of the position of the features or independently therefrom, the dimensions of the features may be subjected to a jitter, i.e. starting from a regular pattern of equal-sized features, one or more dimensions (height, width, etc.) of the features is enlarged or reduced in a random way. Preferably, the amplitude of the deviation from the regular dimensions are distributed according to a predefined statistical distribution (uniform, Gaussian, etc.). Except where not applicable, the above detailed description of the embodiment where the jitter is applied to the position of the features in the regular pattern is valid also for the embodiment wherein the dimensions are subjected to a deviation.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specifically specified, the description of a layer being deposited or produced 'on' another layer or substrate, includes the options of
    said layer being produced or deposited directly on, i.e. in contact with, the other layer or substrate, and
    said layer being produced on one or a stack of intermediate layers between the layer and the other layer or substrate.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

What is claimed is:

1. A method for producing a light emitting diode device, comprising a stack of layers comprising a light producing layer the light producing layer not being the top or bottom layer of the stack, the method comprising:
    providing a light emitting diode device comprising a stack of layers, the stack of layers comprising a light producing layer, wherein the light producing layer is not a top layer or a bottom layer of the stack; and
    subjecting the top layer or the bottom layer of the stack to a texturization, whereby light extraction efficiency of the LED is enhanced, wherein the texturization comprises producing, on a top surface or on a bottom surface of the stack a plurality of surface features, the surface features being arranged according to an irregular pattern defined by starting from:
        a regular pattern of features and subjecting each feature of the regular pattern to a deviation from a location in the regular pattern, wherein the deviation is in a random direction and/or has a random amplitude; or
        a regular pattern of features of equal size and equal shape and subjecting one or more dimensions of each feature of the regular pattern to a random deviation from the one or more dimensions of the features of equal size,
    wherein an amplitude of the deviation is selected according to a predefined statistical distribution.

2. The method of claim 1, wherein an amplitude of the deviation is not higher than a pitch of the features of the regular pattern.

3. The method of claim 1, wherein an amplitude of the deviation is such that essentially no surface features are mutually overlapping in the irregular pattern.

4. The method of claim 1, wherein an amplitude of the deviation is not higher than half of a pitch of the features of the regular pattern.

5. The method of claim 1, wherein the distribution is a uniform distribution or a Gaussian distribution.

6. The method of claim 1, wherein a pitch of the features of the regular pattern is from 0.2 microns to 2 microns.

7. The method of claim 1, wherein the surface features are shaped as cone-shaped pillars or pyramid-shaped pillars, each pillar having a flat top surface and slanted side surfaces, wherein flat areas are situated between the pillars.

8. The method of claim 1, wherein the texturization comprises subjecting the top layer or the bottom layer of the stack to lithography, wherein a mask is used, the mask having openings arranged according to the irregular pattern.

9. The method of claim 1, wherein the surface features are arranged according to an irregular pattern defined by starting from a regular pattern of features and subjecting each feature of the regular pattern to a deviation from a location in the regular pattern, wherein the deviation is in a random direction and/or has a random amplitude.

10. The method of claim 1, wherein the surface features are arranged according to an irregular pattern defined by starting from a regular pattern of features of equal size and equal shape and subjecting one or more dimensions of each feature of the regular pattern to a random deviation from the one or more dimensions of the features of equal size.

11. A method for producing a light emitting diode device, comprising a stack of layers comprising a light producing layer the light producing layer not being the top or bottom layer of the stack, the method comprising:

providing a light emitting diode comprising a stack of layers, the stack of lavers comprising a light producing layer, wherein the light producing layer is not a top layer or a bottom layer of the stack; and subjecting the top layer or the bottom layer of the stack to a texturization, whereby light extraction efficiency of the LED is enhanced, wherein the texturization com rises producing, on a top surface or on a bottom surface of the stack a plurality of surface features, wherein the surface features are shaped as cone-shaped pillars or pyramid-shaped pillars, each pillar having a flat top surface and slanted side surfaces, wherein flat areas are situated between the pillars, wherein a width of the flat top surface of each pillar is configured so that an emission cone emitted from a point of the light producing layer situated underneath a mid-point of the top surface and received by the top surface, essentially corresponds to an escape cone of light emitted by the light producing layer through a non-texturized surface having a same thickness as the top surface, the surface features being arranged according to an irregular pattern defined by starting from:

a regular pattern of features and subjecting each feature of the regular pattern to a deviation from a location in the regular pattern, wherein the deviation is in a random direction and/or has a random amplitude; or a regular pattern of features of equal size and equal shape and subjecting one or more dimensions of each feature of the regular pattern to a random deviation from the one or more dimensions of the features of equal size.

12. The method of claim 11, wherein the slanted side surfaces are inclined at an angle of from 25° to 45° with respect to a plane of the texturized surface.

13. The method of claim 11, wherein the deviation is not higher than one fourth of a pitch of the features of the regular pattern.

\* \* \* \* \*

UNITED STATES PATENT AND TRADEMARK OFFICE
CERTIFICATE OF CORRECTION

Page 1 of 1

PATENT NO. : 8,900,801 B2
APPLICATION NO. : 13/715763
DATED : December 2, 2014
INVENTOR(S) : Maarten Rosmeulen It is certified that error appears in the above-identified patent and that said Letters Patent is hereby corrected as shown below:

In The Specification

In column 4 at line 27, Change "$Si_2N_4$," to --$Si_3N_4$,--.

In The Claims

In column 7 at line 29, In Claim 11, after "diode" insert --device--.

In column 7 at line 30, In Claim 11, change "lavers" to --layers--.

In column 8 at line 1, In Claim 11, change "com rises" to --comprises--.

Signed and Sealed this
Thirtieth Day of June, 2015

Michelle K. Lee
*Director of the United States Patent and Trademark Office*